(12) United States Patent
Hayashi et al.

(10) Patent No.: US 6,787,193 B2
(45) Date of Patent: Sep. 7, 2004

(54) METHOD FOR THE FORMATION OF SILICA FILM, SILICA FILM, INSULATING FILM, AND SEMICONDUCTOR DEVICE

(75) Inventors: Eiji Hayashi, Ibaraki (JP); Atsushi Shiota, Ibaraki (JP); Michinori Nishikawa, Ibaraki (JP); Kinji Yamada, Ibaraki (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/165,324

(22) Filed: Jun. 10, 2002

(65) Prior Publication Data

US 2003/0008155 A1 Jan. 9, 2003

(30) Foreign Application Priority Data

Jun. 11, 2001 (JP) .................................. P. 2001-175600
Jun. 11, 2001 (JP) .................................. P. 2001-175601

(51) Int. Cl.$^7$ ................... B32B 18/00; B32B 9/04; B05D 3/02
(52) U.S. Cl. .................. 427/446; 428/447; 427/96; 427/331; 427/335; 427/387
(58) Field of Search ............... 427/96, 331, 335, 427/387; 428/446, 447

(56) References Cited

U.S. PATENT DOCUMENTS

| | | | |
|---|---|---|---|
| 5,304,515 A | | 4/1994 | Morita et al. |
| 5,800,758 A | * | 9/1998 | Topolkaraev et al. ....... 264/154 |
| 6,410,150 B1 | | 6/2002 | Kurosawa et al. |
| 6,410,151 B1 | | 6/2002 | Kurosawa et al. |
| 6,413,647 B1 | | 7/2002 | Hayashi et al. |
| 6,423,770 B1 | * | 7/2002 | Katz .......................... 524/492 |
| 6,472,079 B2 | | 10/2002 | Hayashi et al. |
| 6,495,264 B2 | | 12/2002 | Hayashi et al. |
| 6,503,633 B2 | * | 1/2003 | Nishikawa et al. ......... 428/447 |
| 6,558,747 B2 | | 5/2003 | Nakata et al. |
| 6,565,764 B2 | * | 5/2003 | Hiraoka et al. ............... 216/56 |
| 6,576,066 B1 | * | 6/2003 | Namatsu ...................... 134/30 |
| 6,576,345 B1 | * | 6/2003 | Van Cleemput et al. .... 428/447 |
| 2003/0012931 A1 | * | 1/2003 | Kuroda et al. .............. 428/188 |
| 2003/0157248 A1 | * | 8/2003 | Watkins et al. ............. 427/256 |

FOREIGN PATENT DOCUMENTS

| | | | | |
|---|---|---|---|---|
| EP | 0 997 497 A1 | * | 5/2000 | .......... C08L/83/04 |
| TW | 232082 | | 10/1994 | |
| TW | 344000 | | 11/1998 | |

OTHER PUBLICATIONS

Provisional application 60/332,625 Watkins et al., filed Nov. 21, 2001.*
U.S. patent application Ser. No. 10/270,066, Shiota et al., filed Oct. 15, 2002.
U.S. patent application Ser. No. 10/103,996, Hayashi et al., filed Mar. 25, 2002.
U.S. patent application Ser. No. 10/165,324, Hayashi et al., filed Jun. 10, 2002.
U.S. patent application Ser. No. 10/269,967, Hayashi et al., filed Oct. 15, 2002.

* cited by examiner

Primary Examiner—Jeffrey B. Robertson
(74) Attorney, Agent, or Firm—Oblon, Spivak, McClelland, Maier & Neustadt, P.C.

(57) ABSTRACT

A method for the formation of a silica film which comprises treating a film in a supercritical medium, the film comprising (A) a siloxane compound and (B) at least one member selected from the group consisting of (B-1) a compound compatible with or dispersible in ingredient (A) and having a boiling or decomposition temperature of from 150 to 500° C. and (B-2) a surfactant. The silica film has excellent mechanical strength showing a dielectric constant of generally 2.2 or lower, and hence is useful as a dielectric film in semiconductor devices and the like.

11 Claims, No Drawings

METHOD FOR THE FORMATION OF SILICA FILM, SILICA FILM, INSULATING FILM, AND SEMICONDUCTOR DEVICE

FIELD OF THE INVENTION

The present invention relates to a method for the formation of a film. More particularly, the invention relates to a silica film which has a dielectric constant as low as 2.2 or below and excellent mechanical strength and is useful as a dielectric film in semiconductor devices, etc.

DESCRIPTION OF THE RELATED ART

Silica ($SiO_2$) films formed by vacuum processes such as CVD have hitherto been used frequently as dielectric films in semiconductor devices and other devices. In recent years, a dielectric film formed from a coating fluid has come to be used for the purpose of forming a more even dielectric film. This film, which is called an SOG (spin on glass) film, comprises a tetraalkoxysilane hydrolyzate as the main component. Furthermore, as a result of the trend toward higher density integration in semiconductor devices and the like, a dielectric film called an organic SOG film has been developed which comprises a polyorganosiloxane as the main component and has a low dielectric constant.

However, with further progress in the high density integration or multilayer interconnetion in semiconductor devices and the like, a dielectric film having a lower dielectric constant and excellent mechanical strength has come to be desired.

Japanese Patent Laid-Open No. 6-181201 discloses an insulating film having a lower dielectric constant for use as a dielectric film. This insulating film is intended to be provided as an insulating film for semiconductor devices which has reduced water absorption properties and excellent cracking resistance. It comprises as the main component an oligomer having a number-average molecular weight of 500 or higher obtained by condensation-polymerizing an organometallic compound containing at least one element selected from titanium, zirconium, niobium, and tantalum with an organosilicon compound having at least one alkoxy group in the molecule.

This insulating film of the related art, however, has a dielectric constant of 2.5 or higher and is hence still insufficient for application to semiconductor devices operating at high frequency. A coating film having an even lower dielectric constant is desired.

SUMMARY OF THE INVENTION

Accordingly, the present invention provides a method for the formation of a film for eliminating the problem described above. More particularly, the present invention provides a method for the formation of a silica film which has excellent mechanical strength showing a dielectric constant of generally 2.2 or lower, preferably 2.0 or lower, more preferably 1.9 or lower, and hence is useful as a dielectric film in semiconductor devices and the like.

One object of the present invention is to provide a method for the formation of a silica film which comprises treating a film in a supercritical medium, the film comprising (A) a siloxane compound and (B) at least one member selected from the group consisting of (B-1) a compound compatible with or dispersible in ingredient (A) and having a boiling or decomposition temperature of from 150 to 500° C. and (B-2) a surfactant.

Another object of the present invention is to provide a silica film obtained by the above method for the formation.

Still another object of the present invention is to provide a low-dielectric film comprising the silica film.

Further object of the present invention is to provide a semiconductor device using the low-dielectric film.

DETAILED DESCRIPTION OF THE INVENTION

In the method of the invention, a film comprising (A) a siloxane compound (hereinafter referred to as "ingredient (A)") and (B) at least one member selected from the group consisting of (B-1) a compound compatible with or dispersible in ingredient (A) and having a boiling or decomposition temperature of from 150 to 500° C. (hereinafter referred to as "ingredient (B-1)") and (B-2) a surfactant (hereinafter referred to as "ingredient (B-2)") is formed on a substrate (this film is hereinafter referred to as a "coating film").

The coating film can be formed by applying a coating composition prepared by dissolving ingredient (A) and ingredient (B) in an organic solvent (hereinafter, this composition is referred to as a "coating composition") to a substrate and removing the organic solvent.

Ingredient (A) is preferably is at least either of a hydrolyzate and condensate of at least one compound selected from the group consisting of compounds represented by the following formula (1) (hereinafter referred to as "compounds (1)"):

$$R^1{}_a Si(OR^2)_{4-a} \quad (1)$$

wherein $R^1$ represents a hydrogen atom, a fluorine atom, or a monovalent organic group; $R^2$ represents a monovalent organic group; and a is an integer of 0 to 3, and compounds represented by the following formula (2) (hereinafter referred to as "compounds (2)"):

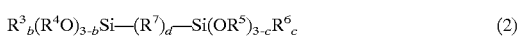

$$R^3{}_b(R^4O)_{3-b}Si-(R^7)_d-Si(OR^5)_{3-c}R^6{}_c \quad (2)$$

wherein $R^3$, $R^4$, $R^5$ and $R^6$ may be the same or different and each represent a monovalent organic group; b and c may be the same or different and each are a number of 0 to 2; $R^7$ represents an oxygen atom or a group represented by $-(CH_2)_2-$, wherein n is 1 to 6; and d is 0 or 1.

Examples of the monovalent organic groups represented by $R^1$ and $R^2$ in the formula (1) include alkyl, aryl, allyl, glycidyl and vinyl groups. In the formula (1), $R^1$ is preferably a monovalent organic group, more preferably an alkyl group or phenyl group.

The alkyl group preferably has 1 to 5 carbon atoms, and examples thereof include methyl, ethyl, propyl and butyl. These alkyl groups may be linear or branched, and may be ones in which one or more of the hydrogen atoms have been replaced, for example, with fluorine atoms.

In the formula (1), examples of the aryl group include phenyl, naphthyl, methylphenyl, ethylphenyl, chlorophenyl, bromophenyl and fluorophenyl.

Specific examples of the compounds represented by the formula (1) include trimethylmethoxysilane, trimethylethoxysilane, trimethylisopropoxysilane, trimethyl-n-butoxysilane, trimethyl-sec-butoxysilane, trimethyl-tert-butoxysilane, trimethylphenoxysilane, triethylmethoxysilane, triethylethoxysilane, triethylisopropoxysilane, triethyl-n-butoxysilane, triethyl-sec-butoxysilane, triethyl-tert-butoxysilane, triethylphenoxysilane, triphenylmethoxysilane, triphenylethoxysilane, triphenylisopropoxysilane, triphenyln-butoxysilane, triphenyl-sec-butoxysilane, triphenyl-tert-butoxysilane and triphenylphenoxysilane; trimethoxysilane, triethoxysilane, tri-n-propoxysilane, triisopropoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotriisopropoxysilane, fluorotri-n-butoxysilane, fluorotri-sec-butoxysilane, fluorotri-tert-butoxysilane, fluorotriphenoxysilane, tetramethoxysilane, tetraethoxysilane, tetra-n-propoxysilane, tetraisopropoxysilane, tetra-n-butoxysilane, tetra-sec-butoxysilane, tetra-tert-butoxysilane and tetraphenoxysilane; methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltrietboxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane and γ-trifluoropropyltriethoxysilane; and dimethyidimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane and divinyltrimethoxysilane.

Of those compounds (1), preferable examples are tetramethoxysilane, tetraethoxysilane, tetra-n-propoxysilane, tetraisopropoxysilane, tetraphenoxysilane, methyltrimethoxysilane, methyltriethoxysilane, methyltri-n-propoxysilane, methyltriisopropoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, diphenyldiethoxysilane, trimethylmonomethoxysilane, trimethylmonoethoxysilane, triethylmonomethoxysilane, triethylmonoethoxysilane, triphenylmonomethoxysilane, triphenylmonoethoxysilane, trimethylmethoxysilane and trimethylethoxysilane.

Examples of the monovalent organic groups in the formula (2) include the same monovalent organic groups as those enumerated above with regard to the formula (1).

Examples of the divalent organic group represented by $R^7$ in the formula (2) include a methylene group and alkylene groups having 2 to 6 carbon atoms.

Examples of the compounds represented by the formula (2) wherein $R^7$ is an oxygen atom include hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentamethoxy-3-phenyldisiloxane, 1,1,1,3,3-pentaethoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,1,3,3-tetraethoxy-1,3-diphenyldisiloxane, 1,1,3-trimethoxy-1,3,3-trimethyldisiloxane, 1,1,3-triethoxy-1,3,3-trimethyldisiloxane, 1,1,3-trimethoxy-1,3,3-triphenyldisiloxane, 1,1,3-triethoxy-1,3,3-triphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane and 1,3-diethoxy-1,1,3,3-tetraphenyldisiloxane. Of those compounds, preferable examples are hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane and 1,3-diethoxy-1,1,3,3-tetraphenyldisiloxane.

Examples of the compounds represented by the formula (2) wherein d is 0 include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentamethoxy-2-phenyldisilane, 1,1,1,2,2-pentaethoxy-2-phenyldisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,1,2,2-tetraethoxy-1,2-diphenyldisilane, 1,1,2-trimethoxy-1,2,2-trimethyldisilane, 1,1,2-triethoxy-1,2,2-trimethyldisilane, 1,1,2-trimethoxy-1,2,2-triphenyldisilane, 1,1,2-triethoxy-1,2,2-triphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane and 1,2-diethoxy-1,1,2,2-tetraphenyldisilane.

Examples of the compounds represented by the formula (2) wherein $R^7$ is a group represented by —$(CH_2)_n$— include bis(hexamethoxysilyl)methane, bis(hexaethoxysilyl)methane, bis(hexaphenoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydipethylsilyl)methane, bis(ethoxydimethylsilyl)methane, bis(methoxydiphenylsilyl)methane, bis(ethoxydiphenylsilyl)methane, bis(hexamethoxysilyl)ethane, bis(hexaethoxysilyl)ethane, bis(hexaphenoxysilyl)ethane, bis(dimethoxymethylsilyl)ethane, bis(diethoxymethylsilyl)ethane, bis(dimethoxyphenylsilyl)ethane, bis(diethoxyphenylsilyl)ethane, bis(methoxydimethylsilyl)ethane, bis(ethoxydimethylsilyl)ethane, bis(methoxydiphenylsilyl)ethane, bis(ethoxydiphenylsilyl)ethane, 1,3-bis(hexamethoxysilyl)propane, 1,3-bis(hexaethoxysilyl)propane, 1,3-bis(hexaphenoxysilyl)propane, 1,3-bis(dimethoxymethylsilyl)propane, 1,3-bis(diethoxymethylsilyl)propane, 1,3-bis(dimethoxyphenylsilyl)propane, 1,3-bis(diethoxyphenylsilyl)propane, 1,3-bis(methoxydimethylsilyl)propane, 1,3-bis(ethoxydimethylsilyl)propane, 1,3-bis(methoxydiphenylsilyl)propane and 1,3-bis(ethoxydiphenylsilyl)propane. Of those compounds, preferable examples are hexamethoxydisilane, hexaethoxydisilane, hexaphenoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,1,2,2-tetraethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, bis(hexamethoxysilyl)methane, bis(hexaethoxysil-yl)methane, bis(dimethoxymethylsilyl)methane, bis(diethoxymethylsilyl)methane, bis(dimethoxyphenylsilyl)methane, bis(di ethoxyphenylsilyl)methane, bis(methoxydimethylsilyl)methane, bis(ethoxydimethylsilyl)methane, bis(methoxydiphenylsilyl)methane and bis(ethoxydiphenylsilyl)methane.

In the present invention, two or more of the compounds (1) and compounds (2) may be used.

When one or more of the compounds (1) and compounds (2) are hydrolyzed and partially condensed, water is preferably used in an amount of generally from 0.3 to 20 mol, preferably from 0.5 to 20 mol, per mole of the groups represented by $R^2O$—, $R^4O$— and $R^5O$— in the formulae (1) and (2).

So long as the amount of water added is in the range of from 0.3 to 20 mol, the composition for film formation to be obtained does not give a coating film having reduced evenness and is less apt to have reduced storage stability.

In the case where ingredient (A) is a condensate, it preferably has a weight-average molecular weight, calculated for standard polystyrene, of from 500 to 2,000,000.

In producing ingredient (A) which is a condensate, a catalyst is used for hydrolyzing and condensing one or more compounds (1) and/or one or more compounds (2). Examples of catalysts that can be used in this reaction include metal chelate compounds, acid catalysts and alkali catalysts.

Examples of catalysts which can be used in the hydrolysis and condensation include metal chelate compounds, acid catalysts and alkali catalysts.

Examples of the metal chelate compounds include titanium chelate compounds such as triethoxymono(acetylacetonato)titanium, tri-n-propoxymono(acetylacetonato)titanium, triisopropoxymono(acetylacetonato)titanium, tri-n-butoxymono(acetylacetonato)titanium, tri-sec-butoxymono(acetylacetonato)titanium, tri-t-butoxymono(acetylacetonato)titanium, diethoxybis(acetylacetonato) titanium, di-n-propoxybis(acetylacetonato)titanium, diisopropoxybis(acetylacetonato)titanium, di-n-butoxybis(acetylacetonato)titanium, di-sec-butoxybis(acetylacetonato)titanium, di-t-butoxybis(acetylacetonato)titanium, monoethoxytris(acetylacetonato)titanium, mono-n-propoxytris(acetylacetonato)titanium, monoisopropoxytris(acetylacetonato)titanium, mono-n-butoxytris(acetylacetonato)titanium, mono-sec-butoxytris(acetylacetonato)titanium, mono-t-butoxytris(acetylacetonato)titanium, tetrakis(acetylacetonato)titanium, triethoxymono( ethyl acetoacetate)titanium, tri-n-propoxymono(ethyl acetoacetate)titanium, triisopropoxymono(ethyl acetoacetate)titanium, tri-n-butoxymono(ethyl acetoacetate)titanium, tri-sec-butoxymono(ethyl acetoacetate)titanium, tri-t-butoxymono(ethyl acetoacetate)titanium, diethoxybis(ethyl acetoacetate)titanium, di-propoxybis(ethyl acetoacetate)titanium, diisopropoxybis(ethyl acetoacetate)titanium, di-n-butoxybis(ethyl acetoacetate)titanium, di-sec-butoxybis(ethyl acetoacetate)titanium, di-t-butoxybis(ethyl acetoacetate)titanium, monoethoxytris(ethyl acetoacetate)titanium, mono-n-propoxytris(ethyl acetoacetate)titanium, monoisopropoxytris(ethyl acetoacetate)titanium, mono-n-butoxytris(ethyl acetoacetate)titanium, mono-sec-butoxytris(ethyl acetoacetate)titanium, mono-t-butoxytris(ethyl acetoacetate)titanium, tetrakis(ethyl acetoacetate)titanium, mono(acetylacetonato)tris(ethyl acetoacetate)titanium, bis(acetylacetonato)bis(ethyl acetoacetate)titanium and tris(acetylacetonato)mono(ethyl acetoacetate)titanium; zirconium chelate compounds such as triethoxymono(acetylacetonato)zirconium, tri-n-propoxymono(acetylacetonato)zirconium, triisopropoxymono(acetylacetonato)zirconium, tri-n-butoxymono(acetylacetonato)zirconium, tri-sec-butoxymono(acetylacetonato)zirconium, tri-t-butoxymono(acetylacetonato)zirconium, diethoxybis(acetylacetonato)zirconium, di-n-propoxybis(acetylacetonato)zirconium, diisopropoxybis(acetylacetonato)zirconium, di-n-butoxybis(acetylacetonato)zirconium, di-sec-butoxybis(acetylacetonato)zirconium, di-t-butoxybis(acetylacetonato)zirconium, monoethoxytris(acetylacetonato)zirconium, mono-n-propoxytris(acetylacetonato)zirconium, monoisopropoxytris(acetylacetonato)zirconium, mono-n-butoxytris(acetylacetonato)zirconium, mono-sec-butoxytris(acetylacetonato)zirconium, mono-t-butoxytris(acetylacetonato)zirconium, tetrakis(acetylacetonato)zirconium, triethoxymono(ethyl acetoacetate)zirconium, tri-n-propoxymono(ethyl acetoacetate)zirconium, triisopropoxymono(ethyl acetoacetate)zirconium, tri-n-butoxymono(ethyl acetoacetate)zirconium, tri-sec-butoxymono(ethyl acetoacetate)zirconium, tri-t- butoxymono(ethyl acetoacetate)zirconium, diethoxybis(ethyl acetoacetate)zirconium, di-n-propoxybis(ethyl acetoacetate)zirconium, diisopropoxybis(ethyl acetoacetate)zirconium, di-n-butoxybis(ethyl acetoacetate)zirconium, di-sec-butoxybis(ethyl acetoacetate)zirconium, di-t-butoxybis(ethyl acetoacetate)zirconium, monoethoxytris(ethyl acetoacetate)zirconium, mono-n-propoxytris(ethyl acetoacetate)zirconium, monoisopropoxytris(ethyl acetoacetate)zirconium, mono-n-butoxytris(ethyl acetoacetate)zirconium, mono-sec-butoxytris(ethyl acetoacetate)zirconium, mono-t-butoxytris(ethyl acetoacetate)zirconium, tetrakis(ethyl acetoacetate)zirconium, mono(acetylacetonato)tris(ethyl acetoacetate)zirconium, bis(acetylacetonato)bis(ethyl acetoacetate)zirconium and tris(acetylacetonato)mono(ethyl acetoacetate)zirconium; and aluminum chelate compounds such as tris(acetylacetonato)aluminum and tris(ethyl acetoacetate)aluminum. Of those compounds, preferable examples are the chelate compounds of titanium and/or aluminum, and more preferable examples are the chelate compounds of titanium.

Those metal chelate compounds may be used alone or in combination of two or more thereof.

Examples of the acid catalysts include inorganic acids such as hydrochloric acid, nitric acid, sulfuric acid, hydrofluoric acid, phosphoric acid, boric acid and oxalic acid; and organic acids such as acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acids, phthalic acid, fumaric acid, citric acid, tartaric acid, succinic acid, itaconic acid, mesaconic acid, citraconic acid, malic acid, a glutaric acid hydrolyzate, a maleic anhydride hydrolyzate and a phthalic anhydride hydrolyzate. Of those, the organic acids are preferably used.

Those acid catalysts may be used alone or in combination of two or more thereof.

Examples of the alkali catalysts include sodium hydroxide, potassium hydroxide, lithium hydroxide, pyridine, pyrrole, piperazine, pyrrolidine, piperidine, picoline, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, ammonia, methylamine, ethylamine, propylamine, butylamine, pentylamine, hexylamine, heptylamine, octylamine, nonylamine, decylamine, N,N-dimethylamine, N,N-diethylamine, N,N-dipropylamine, N,N-dibutylamine, trimethylamine, triethylamine, tripropylamine, tributylamine, cyclohexylamine, trimethylimidine, 1-amino-3-methylbutane and dimethylglycine. Of those, the organic amines are preferably used, and ammonia, the alkylamines and tetramethylammonium hydroxide are more preferably used from the standpoint of adhesive properties of a silica film to substrates.

Those alkali catalysts may be used alone or in combination of two or more thereof.

The catalyst is used in an amount of generally from 0.00001 to 10 mol, preferably from 0.00005 to 5 mol, per mole of the total amount of the $R^2O-$, $R^4O-$ and $R^5O-$ groups contained in the compounds (1) and (2). So long as the catalyst is used in an amount within the above range, polymer precipitation or gelation is difficult to occur during the reaction.

An organic solvent is generally used for the reaction. The organic solvent that can be used is at least one member selected from the group consisting of alcohol solvents, ketone solvents, amide solvents, ester solvents and aprotic solvents.

Examples of the alcohol solvents include monohydric alcohols such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol and diacetone alcohol; polyhydric alcohols such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol and tripropylene glycol; and partial ethers of polyhydric alcohols, such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether.

Those alcohol solvents may be used alone or in combination of two or more thereof.

Examples of the ketone solvents include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohexanone, 2-hexanone, methylcyclohexanone, 2,4-pentanedione, acetonylacetone, acetophenone and fenchone. Examples of the ketone solvents further include β-diketones such as acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione and 1,1,1,5,5,5-hexafluoro-2,4-heptanedione.

Those ketone solvents may be used alone or in combination of two or more thereof.

Examples of the amide solvents include formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropionamide, N-methylpyrrolidone, N-formylmorpholine, N-formylpiperidine, N-formylpyrrolidine, N-acetylmorpholine, N-acetylpiperidine and N-acetylpyrrolidine.

Those amide solvents may be used alone or in combination of two or more thereof.

Examples of the ester solvents include diethyl carbonate, ethylene carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate and diethyl phthalate.

Those ester solvents may be used alone or in combination of two or more thereof.

Examples of the aprotic solvents include acetonitrile, dimethyl sulfoxide, N,N,N',N'-tetraethylsulfamide, hexamethylphosphoric triamide, N-methylmorpholone, N-methylpyrrole, N-ethylpyrrole, N-methy-$\Delta^3$-pyrroline, N-methylpiperidine, N-ethylpiperidine, N,N-dimethylpiperazine, N-methylimidazole, N-methyl-4-piperidone, N-methyl-2-piperidone, N-methyl-2-pyrrolidone, 1,3-dimethyl-2-imidazolidinone and 1,3-dimethyltetrahydro-2(1H)-pyrimidinone.

Ingredient (B)

Ingredient (B-1)

Examples of the compound compatible with or dispersible in ingredient (A) and having a boiling or decomposition temperature of from 150 to 500° C. used in the present invention include (1) compounds having an alkylene oxide structure, (2) (meth)acrylate polymers, (3) polyesters, (4) polycarbonates, (5) polyanhydrides, (6) alkyltrimethylammonium salts and (7) polydimethylsiloxane.

The "boiling or decomposition temperature" used herein means the temperature measured at 1 atm.

(1) Compounds Having Alkylene Oxide Structure

Examples of the alkylene oxide structure include an ethylene oxide structure, propylene oxide structure, tetramethylene oxide structure and butylene oxide structure.

Specific examples of the compounds include ether type compounds such as dioxyethylene alkyl ethers, e.g., dibutyldiethylene glycol, polyoxyethylene alkyl ethers, polyoxyethylene alkylphenyl ethers, polyoxyethylene sterol ethers, polyoxyethylene lanolin derivatives, ethylene oxide derivatives of alkylphenol formalin condensates, polyoxyethylene/polyoxypropylene block copolymers and polyoxyethylene/polyoxypropylene alkyl ethers; ether-ester type compounds such as polyoxyethylene glycerol fatty acid esters, polyoxyethylene sorbitan fatty acid esters, polyoxyethylene sorbitol fatty acid esters and polyoxyethylene fatty acid alkanolamide sulfuric acid salts; and ether-ester type compounds such as polyethylene glycol fatty acid esters, ethylene glycol fatty acid esters, fatty acid monoglycerides, polyglycerol fatty acid esters, sorbitan fatty acid esters, propylene glycol fatty acid esters and sucrose fatty acid esters.

Examples of the polyoxyethylene/polyoxypropylene block copolymers include compounds having either of the following block structures:

—(A)$_n$—(B)$_m$—

—(A)$_n$—(B)$_m$—(A)$_l$— wherein A represents —CH$_2$CH$_2$O—; B represents —CH$_2$CH(CH$_3$)O—; n is a number of 1 to 90; m is a number of 10 to 99; and 1 is a number of 0 to 90.

(2) (Meth)Acrylic Polymers

Examples of acrylic and methacrylic esters constituting (meth)acrylic polymers used in the invention include alkyl acrylates, alkyl methacrylates, alkoxyalkyl acrylates and alkoxyalkyl methacrylates.

Examples of the alkyl acrylates include ones in which the alkyl has 1 to 6 carbon atoms, such as methyl acrylate, ethyl acrylate, n-propyl acrylate, isopropyl acrylate, n-butyl acrylate, isobutyl acrylate, pentyl acrylate and hexyl acrylate. Examples of the alkyl methacrylates include ones in which the alkyl has 1 to 6 carbon atoms, such as methyl methacrylate, ethyl methacrylate, n-propyl methacrylate, isopropyl methacrylate, n-butyl methacrylate, isobutyl methacrylate, butyl methacrylate, pentyl methacrylate and hexyl methacrylate. Examples of the alkoxyalkyl acrylates include methoxymethyl acrylate and ethoxyethyl acrylate. Examples of the alkoxyalkyl methacrylates include methoxymethyl methacrylate and ethoxyethyl methacrylate.

Of those, alkyl methacrylates are preferably used, and ethyl methacrylate, isobutyl methacrylate or the like is more preferably used.

The (meth)acrylic polymer for use in the present invention is preferably formed by copolymerizing one or more of those monomers with a monomer having an alkoxysilyl group.

Examples of the monomer having an alkoxysilyl group include 3-(trimethoxysilyl)propyl methacrylate, 3-(triethoxysilyl)propyl methacrylate, 3-[tri(methoxyethoxy)silyl]propyl methacrylate, 3-(methyldimethoxysilyl)propyl methacrylate, and 3-(methyldiethoxysilyl)propyl methacrylate.

The monomer having an alkoxysilyl group is contained in such an acrylic polymer in a proportion of generally from 0.5 to 10% by mole, preferably from 1 to 7% by mole, based on all monomers constituting the acrylic polymer.

The acrylic polymer used in the present invention may contain, as comonomers, up to 40% by mole of radical-polymerizable monomers other than the above acrylic esters, methacrylic esters and alkoxysilyl-containing monomers.

Examples of the radical-polymerizable monomers include unsaturated carboxylic acids such as acrylic acid and methacrylic acid, unsaturated amides such as N,N-dimethylacrylamide and N,N-dimethylmethacrylamide, unsaturated nitriles such as acrylonitrile, unsaturated ketones such as methyl vinyl ketone, and aromatic compounds such as styrene and a-methylstyrene.

The (meth)acrylic polymer used in the present invention has a number-average molecular weight calculated for standard polystyrene of generally from 1,000 to 100,000, preferably from 1,000 to 20,000.

(3) Polyesters

Examples of the polyesters include polyglycolides, polycaprolactone, polycaprolactonethiol, polypivalolactone, polycondensates of hydroxycarboxylic acids, products of the ring-opening polymerization of lactones and polycondensates of aliphatic polyols with aliphatic polycarboxylic acids.

(4) Polycarbonates

Examples of the polycarbonates include polycondensates of carbonic acid with alkylene glycols, such as poly(ethylene carbonate), poly(propylene carbonate), poly (trimethylene carbonate), poly(tetramethylene carbonate), poly(pentamethylene carbonate) and poly(hexamethylene carbonate).

(5) Polyanhydrides

Examples of the polyanhydrides include polycondensates of dicarboxylic acids, such as poly(malonyl oxide), poly(adipoyl oxide), poly(pimeloyl oxide), poly(suberoyl oxide), poly(azerayl oxide) and poly(sebacoyl oxide).

Other examples of ingredient (B-1) include vinylamide polymers such as poly(N-vinylacetamide), poly(N-vinylpyrrolidone), poly(2-methyl-2-oxazoline) and poly(N,N-dimethylacrylamide), and styrene polymers such as polystyrene, poly(methylstyrene)s and poly(α-methylstyrene).

Compounds having an alkylene oxide structure (1) or acrylate polymers (2) are preferably used as ingredient (B-1). The compounds having an alkylene oxide structure (1), in particular, polyoxyalkylene block copolymers such as polyoxyethylene/polyoxypropylene block copolymers, are more preferably used.

The amount of ingredient (B-1) used is generally from 20 to 300 parts by weight, preferably from 20 to 250 parts by weight, more preferably from 30 to 250 parts by weight, per 100 parts by weight of ingredient (A) (in terms of the product of complete hydrolysis and condensation). When the proportion of ingredient (B-1) is lower than 20 parts by weight, the effect of lowering dielectric constant is insufficient. On the other hand, proportions thereof exceeding 300 parts by weight result in reduced mechanical strength.

The term "product of complete hydrolysis and condensation" as used herein means a product in which all the groups represented by $-OR^2$, $-OR^4$ and $-OR^5$ contained in ingredient (A) have been hydrolyzed into OH groups and then completely condensed.

Ingredient (B-2)

Ingredient (B-2) used in the present invention comprises at least one surfactant, and preferably comprises at least one nonionic surfactant and/or at least one cationic surfactant.

Examples of the nonionic surfactant include $C_{16}H_{33}(OCH_2CH_2)_2OH$ (hereinafter, this structure is referred to as "$C_{16}EO_2$" for brevity), $C_{12}EO_2$, $C_{12}EO_4$, $C_{12}EO_6$, $C_{12}EO_8$, $C_{12}EO_{10}$, $C_{12}EO_{20}$, $C_{14}EO_2$, $C_{14}EO_4$, $C_{14}EO_6$, $C_{14}EO_8$, $C_{14}EO_{10}$, $C_{14}EO_{20}$, $C_{16}EO_4$, $C_{16}EO_6$, $C_{16}EO_8$, $C_{16}EO_{10}$, $C_{16}EO_{20}$, $C_{18}EO_2$, $C_{18}EO_4$, $C_{18}EO_6$, $C_{18}EO_8$, $C_{18}EO_{10}$, $C_{18}EO_{10}$ and $C_{18}EO_{20}$.

Examples of the nonionic surfactant further include various sorbitan fatty acid esters having a hydrophobic part derived from a fatty acid such as oleic acid, lauric acid, stearic acid or palmitic acid. Specific examples of the sorbitan fatty acid esters include $CH_3C(CH_3)CH_2C(CH_3)_2C_6H_4(OCH_2CH_2)_xOH$ (wherein x is 10 on the average), Triton X-100 (Aldrich Inc.), poly(ethylene oxide)(20) sorbitan monolaurate (Tween 20; Aldrich Inc.), poly(ethylene oxide)(20) sorbitan monopalmitate (Tween 40), poly(ethylene oxide)(20) sorbitan monostearate, poly(ethylene oxide)(20) sorbitan monooleate (Tween 60), and sorbitan monopalmitate (Span 40). Such poly(ethylene oxide) type nonionic surfactants may be used alone or in combination of two or more thereof.

A triblock copolymer having three poly(alkylene oxide) chains can also be used. In particular, a triblock copolymer comprising a poly(ethylene oxide) chain/poly(propylene oxide) chain/poly(ethylene oxide) chain can be used. This surfactant has a structure which comprises a poly(propylene oxide) chain at the center and two poly(ethylene oxide) chains disposed respectively on both sides of the center chain and has a hydroxyl group at each end. The basic structure of this triblock copolymer is represented by $(EO)_x(PO)_y(EO)_x$. Symbols x and y are not particularly limited. For example, there are triblock copolymers in which x is from 5 to 110 and y is from 15 to 70. Triblock copolymers in which x is from 15 to 20 and y is from 50 to 60 are preferable. The preferred triblock copolymers are represented by $(EO)_x(PO)_y(EO)_x$ wherein x is a number selected from 15, 16, 18, 19, and 20 and y is an integer in the range of from 50 to 60. A triblock copolymer having a reversed block arrangement, i.e., a copolymer comprising a poly(propylene oxide) chain/poly(ethylene oxide) chain/poly(propylene oxide) chain $((PO)_x(EO)_y(PO)_x)$, can also be used. In this copolymer also, x and y are not particularly limited. However, this triblock copolymer is preferably one in which x is from 5 to 110 and y is from 15 to 70, more preferably one in which x is from 15 to 20 and y is from 50 to 60.

Specific examples of those triblock copolymers include $EO_5PO_{70}EO_5$, $EO_{13}PO_{30}EO_{13}$, $EO_{20}PO_{30}EO_{20}$, $EO_{26}PO_{39}EO_{26}$, $EO_{17}PO_{56}EO_{17}$, $EO_{17}PO_{58}EO_{17}$, $EO_{20}PO_{70}EO_{20}$, $EO_{80}PO_{30}EO_{80}$, $EO_{106}PO_{70}EO_{106}$, $EO_{100}PO_{39}EO_{100}$, $EO_{19}PO_{33}EO_{19}$ and $EO_{26}PO_{39}EO_{26}$. Preferred of these are $EO_{17}PO_{56}EO_{17}$, and $EO_{17}PO_{58}EO_{17}$. These triblock copolymers are commercially available, e.g., from BASF AG. It is also possible to use a small-scale production apparatus to obtain a triblock copolymer having the desired values of x and y. Those triblock copolymers may be used alone or in combination of two or more thereof.

A star diblock copolymer comprising ethylenediamine and two poly(ethylene oxide) chain/poly(propylene oxide) chain structures bonded to each of the two nitrogen atoms of the ethylenediamine can also be used. Examples of the star diblock copolymer include $(EO_{113}PO_{22})_2NCH_2CH_2N(PO_{22}EO_{113})_2$, $(EO_3PO_{18})_2NCH_2CH_2N(PO_{18}EO_3)_2$ and $(PO_{19}EO_{16})_2NCH_2CH_2N(EO_{16}PO_{19})_2$. Such star diblock copolymers may be used alone or in combination of two or more thereof.

Primary alkyl amines and the like can also be used as the nonionic surfactant. The diameter of pores to be obtained can be controlled by selecting a kind of a surfactant used, specifically by regulating, e.g., length of hydrophobic part (s), such as alkyl chains, of a surfactant.

Examples of the cationic surfactant include quaternary long-chain alkylammonium compounds represented by the following formulae (3) and/or (4):

$$R^8R^9R^{10}R^{11}N^+.X^- \qquad (3)$$

wherein $R^8$ to $R^{11}$ each independently are a monovalent hydrocarbon group, provided that at least one of those is an alkyl group having 10 to 24 carbon atoms; and X is an acid anion;

$$R^{12}(N)^+.X^- \qquad (4)$$

wherein $R^{12}$ is an alkyl group having 8 to 24 carbon atoms; (N) represents a pyridine group; and X is an acid anion.

Examples of the ammonium compounds include alkyltrimethylammonium halides, dialkyldimethylammonium halides and alkyldimethylbenzylammonium halides. Specific examples of the ammonium compounds include hexadecyltrimethylammonium chloride, dodecyltrimethylammonium chloride, tetradecyltrimethylammonium chloride, octadecyltrimethylammonium chloride, decyltrimethylammonium chloride, hexadecyltrimethylammonium bromide, dodecyltrimethylammonium bromide, tetradecyltrimethylammonium bromide, octadecyltrimethylammonium bromide, decyltrimethylammonium bromide, hexadecyltrimethylammonium. iodide, dodecyltrimethylammonium iodide, tetradecyltrimethylammonium iodide, octadecyltrimethylammonium iodide, decyltrimethylammonium iodide, hexadecyldimethylbenzylammonium chloride, dodecyldimethylbenzylammonium chloride, tetradecyldimethylbenzylammonium chloride, octadecyldimethylbenzylammonium chloride, decyldimethylbenzylammonium chloride, hexadecyldimethylbenzylammonium bromide, dodecyldimethylbenzylammonium bromide, tetradecyldimethylbenzylammonium bromide, octadecyldimethylbenzylammonium bromide, decyldimethylbenzylammonium bromide, hexadecyldimethylbenzylammonium iodide, dodecyldimethylbenzylammonium iodide, tetradecyldimethylbenzylammonium iodide, octadecyldimethylbenzylammonium iodide and decyldimethylbenzylammonium iodide; and decylpyridinium chloride, dodecylpyridinium chloride, tetradecylpyridinium chloride, hexadecylpyridinium chloride, octadecylpyridinium chloride, decylpyridinium bromide, dodecylpyridinium bromide, tetradecylpyridinium bromide, hexadecylpyridinium bromide, octadecylpyridinium bromide, decylpyridinium iodide, dodecylpyridinium iodide, tetradecylpyridinium iodide, hexadecylpyridinium iodide and octadecylpyridinium iodide.

Those surfactants may be used alone or as mixtures of two or more thereof.

In producing a composition for use in the present invention, ingredient (A) is hydrolyzed and condensed in the presence of ingredient (B-2). The amount of ingredient (B-2) used in this reaction is usually from 5 to 300 parts by weight, preferably from 5 to 250 parts by weight, more preferably from 10 to 250 parts by weight, per 100 parts by weight of ingredient (A) (in terms of the product of complete hydrolysis and condensation). If the amount of ingredient (B-2) is lower than 5 parts by weight, the resulting composition gives a silica film having a dielectric constant exceeding 2.5, and if the amount thereof exceeds 300 parts by weight, the resulting varnish has poor applicability.

In the present invention, ingredients (A) and (B) are usually dissolved in an organic solvent to prepare a coating composition.

The organic solvent used in the invention comprises at least one member selected from the group consisting of the alcohol solvents, ketone solvents, amide solvents, ester solvents and aprotic solvents enumerated above.

The amount of the organic solvent used is generally in the range of from 0.3 to 30 times (by weight) the total amount of ingredient (A) (in terms of the product of complete hydrolysis and condensation) and ingredient (B).

The coating composition used in the present invention can be produced by mixing ingredients (A) and (B) optionally together with other ingredients. Other Additives Ingredients such as colloidal silica, colloidal alumina and surfactants may be added to the composition for forming a film, obtained in the present invention.

The colloidal silica is a dispersion comprising, for example, any of the above-described hydrophilic organic solvents and high-purity silicic acid anhydride dispersed therein. It has an average particle diameter of generally from 5 to 30 nm, preferably from 10 to 20 nm, and a solid concentration of generally about from 10 to 40% by weight. Examples of the colloidal silica include the methanol silica sol and isopropanol silica sol, manufactured by Nissan Chemical Industries, Ltd., and Oscal, manufactured by Catalysts & Chemicals Industries Co., Ltd.

Examples of the colloidal alumina include Alumina Sol 520, 100 and 200, manufactured by Nissan Chemical Industries, Ltd., and Alumina Clear Sol and Alumina Sol 10 and 132, manufactured by Kawaken Fine Chemicals Co., Ltd.

Examples of the surfactants include nonionic surfactants, anionic surfactants, cationic surfactants and amphoteric surfactants, and further include silicone surfactants, poly(alkylene oxide) surfactants and poly(meth)acrylate surfactants.

The coating composition used in the present invention has a total solid concentration of preferably from 2 to 30% by weight. The solid concentration is appropriately regulated according to the intended use. When the composition has a total solid concentration of from 2 to 30% by weight, the composition not only gives a coating film having an appropriate thickness but has better storage stability.

In the coating composition used in the present invention, the content of alcohols having a boiling point of 100° C. or lower is preferably 20% by weight or lower, more preferably 5% by weight or lower. Alcohols having a boiling point of 100° C. or lower may generate during the hydrolysis and/or subsequent condensation of the compounds (1) and (2). In such a case, the alcohols are preferably removed by distillation or another technique such that the content thereof is preferably 20% by weight or lower, more preferably 5% by weight or lower.

The coating composition is applied to a substrate. Examples of the substrate include silicon wafers, $SiO_2$ wafers, and SiN wafers. Coating techniques such spin coating, dip coating, roll coating and spraying can be employed.

After the coating composition is applied to a substrate, the organic solvent is removed from the coating composition to thereby obtain the coating film according to the present invention. The thickness of this coating film is generally from 0.05 to 3 μm, preferably from 0.1 to 2.5 μm.

According to the present invention, the coating film thus formed is treated in a supercritical medium. For this treatment, an apparatus as described in, for example, Japanese Patent Laid-Open No. 2001-60575 can be used.

The supercritical medium is preferably carbon dioxide. One or more other solvents having excellent compatibility with ingredient (B-2) can be added to the supercritical medium, if desired and necessary. Examples of such other solvents optionally added include the above-described organic solvents that are used in the condensation of ingredient (A). The amount of the other solvents used is generally from 0 to 50 parts by weight, preferably from 0 to 30 parts by weight, per 100 parts by weight of the supercritical medium such as carbon dioxide.

Conditions for the treatment of the coating film in a supercritical medium are a temperature of generally from 0 to 200° C., preferably from 20 to 150° C., and a pressure of generally from 10 to 200 atm, preferably from 20 to 180 atm. The treatment time in a supercritical medium is generally from 10 seconds to 2 hours, preferably from 1 minute to 1 hour.

The silica film of the present invention is formed by the method as described above. The film obtained may be rinsed with a solvent or heat-treated, if required and necessary. Examples of the solvent for use in this rinsing include the above-described organic solvents used in the condensation of ingredient (A). The heat treatment can be conducted at a temperature of about from 200 to 500° C. for generally from 5 to 240 minutes. This heating can be conducted with a hot plate, an oven, a furnace or the like, for example, under atmospheric pressure, in a nitrogen or argon atmosphere, under vacuum or under reduced-pressure having a controlled oxygen concentration.

The film thus obtained has a density of generally from 0.3 to 1.3 $g/cm^3$, preferably from 0.3 to 1.2 $g/cm^3$, and further has an exceedingly low dielectric constant, excellent insulating properties and excellent surface hardness. Consequently, the film according to the present invention is useful in applications such as dielectric films for semiconductor devices such as LSIs, system LSIs, DRAMs, SDRAMs, RDRAMs and D-RDRAMs, protective films such as surface coat films for semiconductor devices, dielectric films for multilayered wiring boards, protective or insulating films for liquid-crystal display elements, and protective or insulating films for electroluminescent display elements.

The present invention will be explained in more detail by reference to the Examples.

In the following Examples and Comparative Examples, all "parts" and "percents" are by weight unless otherwise indicated.

The silica films obtained in the Examples and Comparative Examples were evaluated by the following methods.

Dielectric Constant

An aluminum electrode pattern was formed on a silica film-coated substrate by vapor deposition to prepare a sample for the measurement of dielectric constant. This sample was examined at a frequency of 100 kHz with electrodes HP16451B-2 and precision LCR meter HP4284A, both manufactured by Yokogawa-Hewlett-Packard, Ltd., by the CV method to determine the dielectric constant of the silica film.

Hardness of Silica Film

The modulus of elasticity of a silica film was measured with Nano Indenter XP (manufactured by Nano Instruments Inc.) by a continuous measurement method for rigidity.

SYNTHESIS EXAMPLE 1

324.40 g of methyltrimethoxysilane and 123.64 g of triethoxysilane were dissolved in 298 g of propylene glycol monoethyl ether in a separable flask made of quartz. This solution was stirred with a Three-One Motor to maintain the solution temperature at 50° C. 254 g of ion-exchanged water containing 0.20 g of maleic acid dissolved therein was added to the solution over 1 hour. The mixture was reacted at 50° C. for 3 hours. 502 g of propylene glycol monoethyl ether was added to the reaction mixture. The resulting reaction mixture was cooled to room temperature. 502 g of a solution containing methanol and ethanol was removed from the reaction mixture by evaporation at 50° C., thereby obtaining a reaction mixture (1).

SYNTHESIS EXAMPLE 2

243.30 g of methyltrimethoxysilane, 101.24 g of tetramethoxysilane, 123.64 g of triethoxysilane and 0.02 g of tetrakis(acetylacetonato)titanium were dissolved in 254 g of dipropylene glycol dimethyl ether in a separable flask made of quartz. This solution was stirred with a Three-One Motor to maintain the solution temperature at 50° C. 278 g of ion-exchanged water was added to the solution over 1 hour. The resulting mixture was reacted at 50° C. for 3 hours. 546 g of dipropylene glycol dimethyl ether was added to the mixture, and the resulting reaction mixture was cooled to room temperature. 546 g of a solution containing methanol and ethanol was removed from the reaction mixture by evaporation at 50° C., thereby obtaining a reaction mixture (2).

SYNTHESIS EXAMPLE 3

470.9 g of distilled ethanol, 226.5 g of ion-exchanged water, and 17.2 g of 25% aqueous tetramethylammonium hydroxide solution were placed in a separable flask made of quartz, and were uniformly stirred. A mixture of 44.9 g of methyltrimethoxysilane and 68.6 g of tetraethoxysilane was added to this solution over 2 hours. The resulting solution was reacted for 6 hours while maintaining the solution at 58° C. 80 g of 20% aqueous maleic acid solution was added to this solution. The resulting mixture was sufficiently stirred and then cooled to room temperature. 400 g of propylene glycol monopropyl ether was added to this solution. Subsequently, the resulting solution was concentrated with a 50° C. evaporator until the concentration thereof reached 10% (in terms of the content of the product of complete hydrolysis and condensation). 10 g of a 10% maleic acid solution in propylene glycol monopropyl ether was added to the concentrated solution, thereby obtaining a reaction mixture

SYNTHESIS EXAMPLE 4

Reaction was conducted in the same manner as in Synthesis Example 3. The subsequent concentration was conducted until the solution had a concentration of 12.5% (in terms of the content of the product of complete hydrolysis and condensation). Thus, a reaction mixture (4) was obtained.

Example 1

20 g of polyethylene glycol having a weight-average molecular weight of 2,000 was added to 100 g of the reaction mixture (1) obtained in Synthesis Example 1, followed by sufficiently stirring. The resulting solution was filtered through a Teflon filter having an opening diameter of 0.2 $\mu$m to obtain a coating liquid (1).

This coating liquid (1) was applied as a composition sample to an 8-inch silicon wafer by spin coating. The substrate thus coated was treated on a hot plate at 90° C. for 1 minute and then in a nitrogen atmosphere at 200° C. for 1 minute.

The coated substrate obtained was placed in a closed chamber made of zirconium, and then treated with a supercritical medium under the following conditions.

Medium: carbon dioxide

Temperature: 100° C.

Pressure: 140 atm

Time: 5 minutes

The dielectric constant of the substrate thus treated was measured and was found to be as low as 2.18. Silica film formed on the substrate had excellent mechanical strength such that the hardness thereof was 0.62.

Example 2

The substrate obtained in Example 1 through the supercritical treatment was burned on a 400° C. hot plate for 30 minutes in a nitrogen atmosphere.

The dielectric constant of this substrate was measured and was found to be as low as 2.05. The silica film had excellent mechanical strength such that the hardness thereof was 0.68.

Examples 3 to 8

Coated substrates were produced and evaluated in the same manner as in Example 2, except that the compositions shown in Tables 1 and 2 were used and a supercritical treatment was conducted under the conditions shown in Tables 1 and 2. The evaluation results obtained are shown in Tables 1 and 2.

Examples 9 to 11

Each of the compositions shown in Table 3 was added to 80 g of the reaction mixture (4) obtained in Synthesis Example 4. The mixture was sufficiently stirred, and the resulting solution was filtered through a Teflon filter having an opening diameter of 0.2 μm. Thus, coating liquids were obtained.

Those coating liquids each were applied as a composition sample to an 8-inch silicon wafer by spin coating to obtain coated substrates. The coated substrates obtained were treated under the supercritical conditions shown in Table 3. The evaluation results obtained are shown in Table 3.

TABLE 1

| Example | Ingredient (A) | Ingredient (B-1) | Medium | Conditions for supercritical treatment Temperature (° C.) | Pressure (atm) | Time (min) | Dielectric constant of coating | Film hardness (GPa) |
|---|---|---|---|---|---|---|---|---|
| 1 | Reaction mixture (1) 100 g | Polyethylene glycol having weight-average molecular weight of 2000; 20 g | Carbon dioxide | 100 | 145 | 5 | 2.18 | 0.62 |
| 2 | Reaction mixture (1) 10 g | Polyethylene glycol having weight-average molecular weight of 2000; 20 g | Carbon dioxide | 100 | 145 | 5 | 2.05 | 0.68 |
| 3 | Reaction mixture (1) 100 g | Newpol PE-61, manufactured by Sanyo Chemical Industries, Ltd.; 35 g | Carbon dioxide/ ethanol = 95/5 (by weight) | 100 | 120 | 5 | 1.76 | 0.42 |

TABLE 2

| Example | Ingredient (A) | Ingredient (B-1) | Medium | Conditions for supercritical treatment Temperature (° C.) | Pressure (atm) | Time (min) | Dielectric constant of coating | Film hardness (GPa) |
|---|---|---|---|---|---|---|---|---|
| 4 | Reaction mixture (2) 100 g | Poly(isobutyl methacrylate) having weight-average molecular weight of 2000; 30 g | Carbon dioxide/ toluene = 95/5 (by weight) | 100 | 120 | 5 | 1.88 | 0.43 |
| 5 | Reaction mixture (2) 100 g | Poly(ethylene carbonate) having weight-average molecular weight of 2000; 30 g | $CO_2$/ toluene = 95/5 (by weight) | 100 | 120 | 5 | 1.93 | 0.44 |
| 6 | Reaction mixture (3) 100 g | Polycaprolactone having weight-average molecular weight of 2000; 30 g | $CO_2$/ethyl acetate = 95/5 (by weight) | 120 | 100 | 5 | 1.77 | 0.55 |
| 7 | Reaction mixture (3) 100 g | Poly(malonyl oxide) having weight-average molecular weight of 2000; 30 g | $CO_2$/ethyl acetate = 95/5 (by weight) | 120 | 100 | 5 | 1.75 | 0.55 |
| 8 | Reaction mixture (3) 100 g | Poly(methylstyrene) having weight-average molecular weight of 2000; 40 g | $CO_2$/ethyl acetate = 95/5 (by weight) | 120 | 100 | 5 | 1.49 | 0.38 |

TABLE 3

| Example | Ingredient (A) | Ingredient (B-1) | Medium | Conditions for supercritical treatment Temperature (° C.) | Pressure (atm) | Time (min) | Dielectric constant of coating | Film hardness (GPa) |
|---|---|---|---|---|---|---|---|---|
| 9 | Reaction mixture (4) 80 g | Poly(propylene carbonate) having weight-average molecular weight of 2000; 20 g | Carbon Dioxide | 40 | 140 | 60 | 2.02 | 0.61 |
| 10 | Reaction mixture (4) 80 g | Poly(ethyl methacrylate) having weight-average molecular weight of 2000; 20 g | Carbon dioxide | 40 | 140 | 60 | 1.98 | 0.56 |
| 11 | Reaction mixture (4) 80 g | Dibutyldiethylene glycol DB-2DG, manufactured by Nippon Nyukazai Co., Ltd.; 20 g | Carbon dioxide | 40 | 140 | 60 | 1.90 | 0.40 |

SYNTHESIS EXAMPLE 5

1.76 g of the nonionic surfactant represented by the formula $EO_{17}PO_{58}EO_{17}$ was dissolved in 105 g of ion-exchanged water in a separable flask made of quartz, and 20 g of 12-N hydrochloric acid was added thereto. This solution was heated to 45° C., and 4.73 g of tetraethoxysilane was added thereto. The resulting mixture was reacted for 8 hours to obtain a reaction mixture (5).

SYNTHESIS EXAMPLE 6

The reaction mixture (5) obtained in Synthesis Example 5 was further reacted at 80° C. for 8 hours to thereby obtain a reaction mixture (6).

SYNTHESIS EXAMPLE 7

A mixture of 10 g of tetramethoxysilane, 3.25 g of methyltrimethoxysilane, 3.5 g of hexadecyltrimethylammonium chloride and 100 g of ion-exchanged water was stirred in a separable flask made of quartz. The pH of the resulting solution was adjusted to 1 with 12N hydrochloric acid. This solution was reacted at 20° C. for 24 hours to thereby obtain a reaction mixture (7).

SYNTHESIS EXAMPLE 8

324.40 g of methyltrimethoxysilane, 123.64 g of triethoxysilane and 125 g of sorbitan monolaurate (Tween 20; Aldrich Inc.) were dissolved in 298 g of ethanol. This solution was stirred with a Three-One Motor to maintain the solution temperature at 50° C. 254 g of ion-exchanged water containing 0.20 g of maleic acid dissolved therein was added to the solution over 1 hour. The resulting mixture was reacted at 50° C. for 3 hours. 502 g of propylene glycol monoethyl ether was then added thereto, and this reaction mixture was cooled to room temperature. 502 g of a solution containing methanol and ethanol was removed from the reaction mixture by evaporation at 50° C. Thus, a reaction mixture (8) was obtained.

SYNTHESIS EXAMPLE 9

243.30 g of methyltrimethoxysilane, 101.24 g of tetramethoxysilane, 123.64 g of triethoxysilane, 0.02 g of tetrakis(acetylacetonato)titanium and 50 g of hexadecylpyridinium chloride were dissolved in 254 g of dipropylene glycol dimethyl ether in a separable flask made of quartz. This solution was stirred with a Three-One Motor to maintain the solution temperature at 50° C. 278 g of ion-exchanged water was added to the solution over 1 hour. The resulting mixture was reacted at 50° C. for 3 hours. 546 g of dipropylene glycol dimethyl ether was added thereto, and this reaction mixture was cooled to room temperature. 546 g of a solution containing methanol and ethanol was removed from the reaction mixture by evaporation at 50° C. Thus, a reaction mixture (9) was obtained.

SYNTHESIS EXAMPLE 10

470.9 g of distilled ethanol, 226.5 g of ion-exchanged water, 25 g of $C_{16}EO_4$ and 17.2 g of 25% aqueous tetramethylammonium hydroxide solution were placed in a separable flask made of quartz, followed by uniformly stirring. A mixture of 44.9 g of methyltrimethoxysilane and 68.6 g of tetraethoxysilane was added to this solution over 2 hours. The resulting solution was reacted for 6 hours while being kept at 58° C. 80 g of 20% aqueous maleic acid solution was added to this solution. This mixture was sufficiently stirred and then cooled to room temperature. 400 g of propylene glycol monopropyl ether was added to this solution. The resulting solution was concentrated with a 50° C. evaporator until the concentration thereof reached 10% (in terms of the content of the product of complete hydrolysis and condensation). 10 g of a 10% maleic acid solution in propylene glycol monopropyl ether was added to the concentrated solution. Thus, a reaction mixture (10) was obtained.

Example 12

100 g of the reaction mixture (5) obtained in Synthesis Example 5 was filtered through a Teflon filter having an opening diameter of 0.2 μm and then applied as a composition sample to an 8-inch silicon wafer by spin coating. The substrate coated was dried on a hot plate at 90° C. for 1 minute and then in a nitrogen atmosphere at 200° C. for 1 minute.

The coated substrate obtained was placed in a closed chamber made of zirconium, and then dried with a supercritical medium under the following conditions.

Medium: carbon dioxide

Temperature: 100° C.

Pressure: 140 atm

Time: 5 minutes

The dielectric constant of the substrate thus dried was measured and was fount to be as low as 2.19. This silica film had extremely low hygroscopicity, which was equal to or lower than that of $CVD-SiO_2$.

Example 13

The substrate obtained in Example 12 through the supercritical drying was burned on a 400° C. hot plate for 30 minutes in a nitrogen atmosphere.

The dielectric constant of this substrate was measured and was found to be as low as 2.06. This silica film had extremely low hygroscopicity, which was equal to or lower than that of $CVD-SiO_2$.

Examples 14 to 19

Coated substrates were produced and evaluated in the same manner as in Example 13, except that the compositions shown in Table 4 were used and a supercritical treatment was conducted under the conditions shown in Table 4. The evaluation results obtained are shown in Table 4.

TABLE 4

| Example | Reaction mixture | Conditions for supercritical drying | | | | Dielectric constant of film | Water absorption of film |
|---|---|---|---|---|---|---|---|
| | | Medium | Temperature (° C.) | Pressure (atm) | Time (min) | | |
| 12 | (5) | Carbon dioxide | 100 | 145 | 5 | 2.19 | ○ |
| 13 | (5) | Carbon dioxide | 100 | 145 | 5 | 2.06 | ○ |
| 14 | (6) | Carbon dioxide/ ethanol = 95/5 (by weight) | 100 | 120 | 5 | 1.99 | ○ |
| 15 | (7) | Carbon dioxide/ toluene = 95/5 (by weight) | 100 | 120 | 5 | 1.88 | ○ |
| 16 | (8) | Carbon dioxide/ toluene = 95/5 (by weight) | 100 | 120 | 5 | 1.99 | ○ |
| 17 | (9) | Carbon dioxide/ ethyl acetate = 95/5 (by weight) | 120 | 100 | 5 | 1.79 | ○ |
| 18 | (10) | Carbon dioxide/ ethyl acetate = 95/5 (by weight) | 120 | 100 | 5 | 1.65 | ○ |
| 19 | (10) | Carbon dioxide/ ethanol = 95/5 (by weight) | 120 | 100 | 5 | 1.55 | ○ |

Comparative Example 1

A coated substrate was produced and evaluated in the same manner as in Example 1, except that polyethylene glycol having a weight-average molecular weight of 2,000 was not added.

The silica film thus obtained had a dielectric constant as high as 2.99, although it had excellent mechanical strength with a hardness of 0.65.

Comparative Example 2

A coated substrate was produced and evaluated in the same manner as in Example 1, except that drying with a supercritical medium was omitted.

The silica film thus obtained had poor mechanical strength with a hardness of 0.22, and had a dielectric constant as high as 2.55.

According to the present invention, a silica film having a dielectric constant of 2.2 or lower and excellent mechanical strength can be provided.

What is claimed is:

1. A method for the formation of a silica film which comprises subjecting a film obtained by a method which comprises treating a film in a supercritical medium, the film comprising (A) a siloxane compound and (B) at least one member selected from the group consisting of (B-1) a compound compatible with or dispersible in ingredient (A) and having a boiling or decomposition temperature of from 150 to 500° C. and (B-2) a surfactant, to heat treatment at 200 to 500° C., wherein at least one of the following (i), (ii) and (iii) applies:

(i) (B-1) is contained in an amount of from 20 to 300 parts by weight per 100 parts by weight of the ingredient (A) (in terms of the product of complete hydrolysis and condensation), (ii) (B-2) comprises at least one member selected from the group consisting of nonionic surfactants and cationic surfactants, (iii) (B-2) is contained in an amount of from 5 to 300 parts by weight per 100 parts by weight of ingredient (A) (in terms of the product of complete hydrolysis and condensation).

2. The method as claimed in claim 1, wherein the siloxane compound (A) is at least either of a hydrolyzate and condensate of at least one compound selected from the group consisting of compounds represented by the following formula (1):

$$R^1{}_a Si(OR^2)_{4-a} \qquad (1)$$

wherein $R^1$ represents a hydrogen atom, a fluorine atom or a monovalent organic group; $R^2$ represents a monovalent organic group; and a is an integer of 0 to 3, and compounds represented by the following formula (2):

$$R^3{}_b(R^4O)_{3-b}Si-(R^7)_d-Si(OR^5)_{3-c}R^6{}_c \qquad (2)$$

wherein $R^3$, $R^4$, $R^5$ and $R^6$ may be the same or different and each represent a monovalent organic group; b and c may be the same or different and each are a number of 0 to 2; $R^7$ represents an oxygen atom or a group represented by $-(CH_2)_n-$, wherein n is 1 to 6; and d is 0 or 1.

3. The method as claimed in claim 1, wherein the ingredient (B-1) comprises at least one member selected from the group consisting of compounds having an alkylene oxide structure, (meth)acrylic polymers, polyesters, polycarbonates and polyanhydrides.

4. The method as claimed in claim 1, wherein the ingredient (B-1) is contained in an amount of from 20 to 300 parts by weight per 100 parts by weight of the ingredient (A) (in terms of the product of complete hydrolysis and condensation).

5. The method as claimed in claim 1, wherein the ingredient (B-2) comprises at least one member selected from the group consisting of nonionic surfactants and cationic surfactants.

6. The method as claimed in claim 1, wherein the ingredient (B-2) is contained in an amount of from 5 to 300 parts by weight per 100 parts by weight of ingredient (A) (in terms of the product of complete hydrolysis and condensation).

7. The method as claimed in claim 1, wherein the supercritical medium comprises carbon dioxide.

8. The method as claimed in claim 1, wherein the treatment in the supercritical medium is conducted under the conditions of a temperature of from 0 to 200° C. and a pressure of from 10 to 200 atm.

9. A silica film obtained by the method as claimed in claim 1.

10. A low-dielectric film comprising the silica film as claimed in claim 9.

11. A semiconductor device having the low-dielectric film as claimed in claim 10.

* * * * *